(12) United States Patent
Seo

(10) Patent No.: US 7,964,461 B2
(45) Date of Patent: Jun. 21, 2011

(54) METHOD OF FORMING ISOLATION LAYER IN SEMICONDUCTOR DEVICE

(75) Inventor: Young Hee Seo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 49 days.

(21) Appl. No.: 11/964,697

(22) Filed: Dec. 26, 2007

(65) Prior Publication Data

US 2008/0213969 A1 Sep. 4, 2008

(30) Foreign Application Priority Data

Feb. 15, 2007 (KR) .............................. 10-2007-15906

(51) Int. Cl.
*H01L 21/336* (2006.01)

(52) U.S. Cl. ........ 438/257; 438/201; 438/207; 438/221; 438/294; 438/778; 257/E21.545; 257/E21.548

(58) Field of Classification Search ............... 438/424, 438/427, 428, 435, 436, 448, 452, 453, 197, 438/201, 207, 211, 216, 218, 221, 257, 265, 438/294, 296, 299, 734, 778, 787, 791; 257/E21.626, E21.628, E21.545, E21.548, 257/E21.49

See application file for complete search history.

(56) References Cited

U.S. PATENT DOCUMENTS

| | | | | |
|---|---|---|---|---|
| 7,416,956 B2 * | 8/2008 | Yuan | ............................ | 438/427 |
| 2002/0155721 A1 * | 10/2002 | Wang et al. | .................... | 438/700 |
| 2003/0013271 A1 * | 1/2003 | Knorr et al. | .................... | 438/435 |
| 2003/0219967 A1 * | 11/2003 | Tanaka | ........................ | 438/618 |
| 2004/0002217 A1 * | 1/2004 | Mazur et al. | ................... | 438/696 |
| 2004/0142534 A1 * | 7/2004 | Yoo et al. | ....................... | 438/311 |
| 2007/0020882 A1 * | 1/2007 | Kim et al. | ....................... | 438/427 |
| 2007/0059898 A1 * | 3/2007 | Shin et al. | ....................... | 438/424 |
| 2009/0053874 A1 * | 2/2009 | Dubois et al. | ................. | 438/433 |

FOREIGN PATENT DOCUMENTS

| | | |
|---|---|---|
| KR | 102004000199 | 1/2004 |
| KR | 102005000230 | 1/2005 |
| KR | 10-2006-0105857 A | 10/2006 |

OTHER PUBLICATIONS

Office Action for corresponding Korean Application No. 10-2007-0015906, dated May 26, 2010.

* cited by examiner

*Primary Examiner* — Evan Pert
*Assistant Examiner* — Eduardo A Rodela
(74) *Attorney, Agent, or Firm* — Marshall, Gerstein & Borun LLP

(57) ABSTRACT

The present invention is related to a method of forming an isolation layer in a semiconductor device and comprises the steps of forming a tunnel insulating layer and conductive layer patterns on an active area of a semiconductor substrate, the width of an upper portion of the conductive layer patterns being narrower than that of a lower portion; forming a trench between the conductive layer patterns on the semiconductor substrate; forming an insulating layer to fill a portion of the trench with the insulating layer; and performing an etching process to remove an overhang of the insulating layer formed at an upper edge of the conductive layer patterns. Here, the step of forming the insulating layer and the step of performing the etching process are repeatedly performed until a space between the conductive layer patterns and the trench are filled with the insulating layer.

8 Claims, 4 Drawing Sheets

METHOD OF FORMING ISOLATION LAYER IN SEMICONDUCTOR DEVICE

CROSS-REFERENCE TO RELATED APPLICATIONS

The priority of Korean Patent Application No. 2007-15906, filed on Feb. 15, 2007, is hereby claimed and the disclosure thereof is hereby incorporated herein by reference in its entirety.

BACKGROUND OF THE INVENTION

The present invention relates to a method of forming an isolation layer in a semiconductor device, and more particularly relates to a method of forming an isolation layer in a semiconductor device for improving a shift of a threshold voltage of an adjacent memory cell caused by an interference phenomenon of a cell.

As semiconductor devices become more high-integrated, the width of trenches becomes narrower and the depth of trenches becomes deeper, and so it is more difficult to completely gap-fill the trench with a high density plasma (HDP) oxide layer, which has been conventionally used, to form an isolation layer without creating a void. To solve the above-identified problems, a SOG (spin on glass) method is utilized. As compared with the method utilizing the high density plasma (HDP) oxide layer, however, the SOG method has the problem of shifting cycling threshold voltage of the semiconductor device.

To improve the problem of shifting cycling threshold voltage of the semiconductor device, an attack against the conductive layer should be prevented by securing a thickness of oxide layer formed on a side wall of the trench.

To secure a thickness of the oxide layer formed on a side wall of the trench, however, the thickness of the high density plasma (HDP) oxide layer should be increased when the high density plasma oxide layer is formed on a surface of the trench. But, the high density plasma (HDP) oxide layer forms an overhang on an upper area of the trench.

Due to the above-described overhang, it is difficult to form a high density plasma (HDP) oxide layer having a thickness of 1,000 Å or more.

SUMMARY OF THE INVENTION

The present invention provides a method for improving a shift of cycling threshold voltage and preventing an overhang from being formed on an upper area of a trench.

The method of forming an isolation layer in a semiconductor device according to one embodiment of the present invention comprises the steps of forming a tunnel insulating layer and conductive layer patterns on an active area of a semiconductor substrate, the width of an upper portion of the conductive layer patterns being narrower than that of a lower portion; forming a trench between the conductive layer patterns on the semiconductor substrate; forming an insulating layer to filling a portion of the trench with the insulating layer; and performing an etching process to remove an overhang of the insulating layer formed at an upper edge of the conductive layer patterns. Here, the step of forming the insulating layer and the step of performing the etching process are repeatedly performed until a space between the conductive layer patterns and the trench are filled with the insulating layer.

In the above steps, the upper portion of the conductive layer patterns with a narrow width preferably includes a spacer which is the most thickly formed on a side wall thereof. Also, the step of forming the conductive layer patterns having an upper portion with a width narrower than that of a lower portion comprises the steps of forming the tunnel insulating layer, a first conductive layer and a second conductive layer on the semiconductor substrate; patterning the second conductive layer; forming a spacer on a side wall of the patterned second conductive layer; etching the first conductive layer, the tunnel insulating layer and a portion of the semiconductor substrate through an etching process in which the spacer is used as an etching mask to form the trench; and removing the spacer.

The spacer preferably is removed through a wet etching process. The spacer preferably is removed to secure a space formed at a side of the second conductive layer in a range of 45 nm to 55 nm. The insulating layer preferably is formed of a high density plasma oxide layer so that the insulating layer formed on a bottom surface of the trench is thicker than that formed on a side wall of the trench. And, the insulating layer is formed on side walls of the trench and preferably has a thickness of 100 Å to 200 Å. The etching process preferably is a wet etching process.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiment of the present invention will be explained in more detail with reference to the accompanying drawings.

FIG. 1A to FIG. 1G are sectional views of a semiconductor device for illustrating a method of forming an isolation layer in a semiconductor device according to the present invention. Although the description below is limited to only a cell area, a process according to the present invention also can be applied to a peripheral area.

Figure 1A:
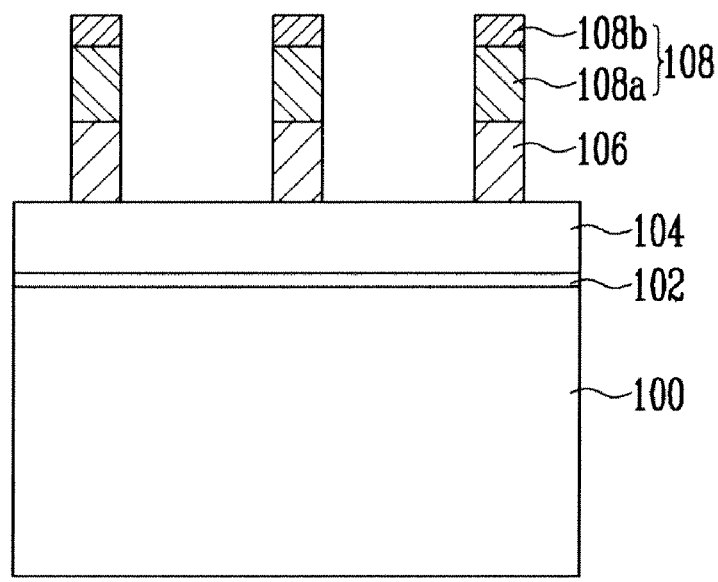
FIG. 1A to FIG. 1G are sectional views of a semiconductor device for illustrating a method of forming an isolation layer in a semiconductor device according to the present invention.

Referring to FIG. 1A, a tunnel insulating layer 102, a first conductive layer 104 for a floating gate and a second conductive layer 106 (not shown in full) are sequentially formed on a semiconductor substrate 100. In this embodiment, the tunnel insulating layer 102 is formed of an oxide layer and the first and second conductive layers 104 and 106 are formed of a polysilicon layer.

Then, a hard mask layer 108 (not shown in full) is formed on the second conductive layer 106. In this embodiment, the hard mask layer 108 has a stacked structure consisting of a nitride layer 108a (not shown in full) and an oxide layer 108b (not shown in full). Photoresist patterns (not shown) are formed on the hard mask layer 108, and an etching process in which the photoresist patterns are utilized as an etching mask is then performed to pattern the hard mask layer 108 as shown. After the photoresist patterns are removed, an etching process in which the patterned hard mask layer 108 is utilized as an etching mask is carried out to etch the second conductive layer 106 as shown.

Figure 1B:
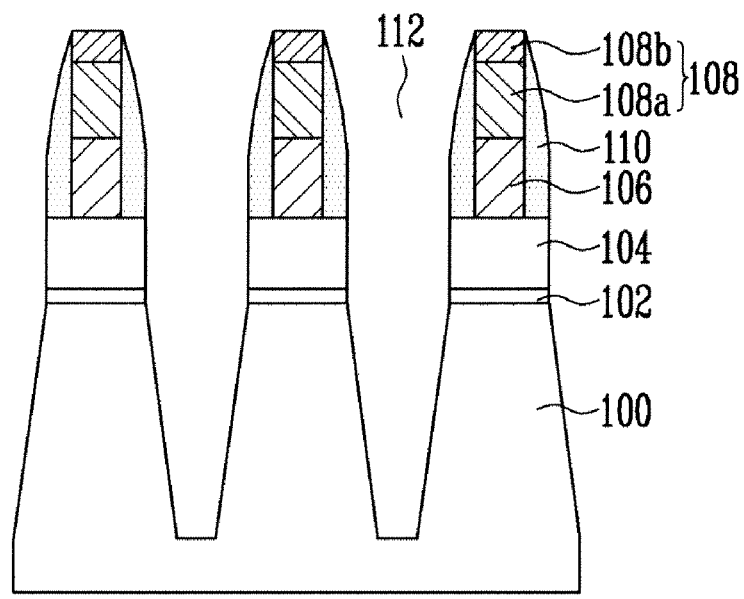

Referring to FIG. 1B, a first insulating layer for a spacer (not shown in full) is formed on the semiconductor substrate 100 including the patterned hard mask layer 108 and the patterned second conductive 106. In this embodiment, the first insulating layer is formed of an oxide layer. The insulating layer is etched through an etching process to form a spacer 110 as shown on side walls of the patterned hard mask layer 108 and the patterned second conductive layer 106. Subsequently, or preferably simultaneously, the first conductive layer 104, the tunnel insulating layer 102 and a portion of the semiconductor substrate 100 are etched by means of the spacer as an etching mask to form an isolation trench 112. In this embodiment, a critical dimension (CD) of the first conductive layer 104 is the same as the sum of the critical dimension of the second conductive layer 106 and the width of the spacer 110 so that the critical dimension of the second conductive layer 106 is smaller than that of the second conductive layer 104.

Figure 1C:
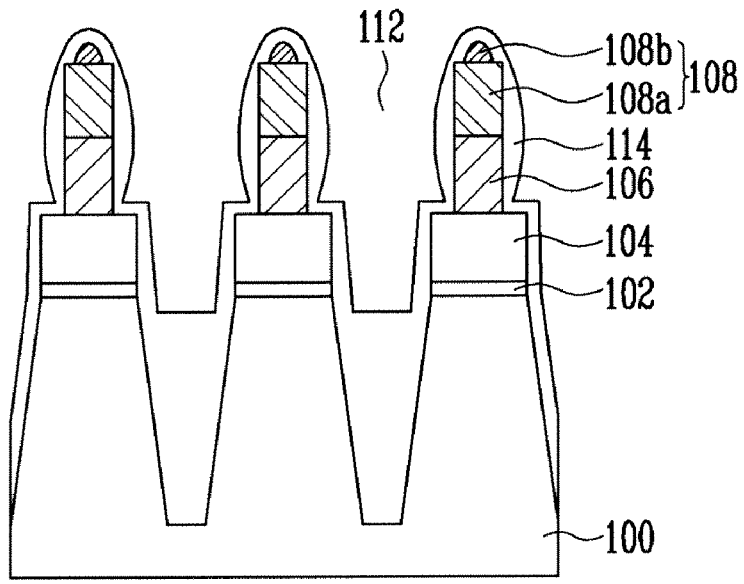

Referring to FIG. 1C, a wet etching process is performed to remove the spacer 110. In this embodiment, some of an upper portion of the oxide layer 108b of the hard mask layer 108 is damaged and removed during the process for removing the spacer 110. By removing the spacer 110, it is possible to secure a space formed at sides of the second conductive layer 106 and the hard mask layer 108, for example in a range of 45 nm to 55 nm. By removing the spacer 110, it is possible to form a transformed floating gate having an upper area with a small critical dimension and a lower area with a large critical dimension.

Then, a second insulating layer 114 is formed on the semiconductor substrate 100 including the trench 112. See FIG. 1C. In this embodiment, the second insulating layer 114 is formed such that the second insulating layer formed on a bottom surface of the trench 112 is thicker that that formed on a side wall of the trench so that a portion of the trench 112 is filled with the second insulating layer to lower the aspect ratio. To achieve the above purpose, it is preferable that the second insulating layer 114 is formed of a high density plasma (HDP) oxide layer. The second insulating layer 114 formed on a side wall of the trench 112 preferably has a thickness in a range of 100 Å to 200 Å. Due to the profile of the transformed floating gates 104 and 106, it is possible to minimize the overhang formed on an upper area of the trench 112.

Figure 1D:
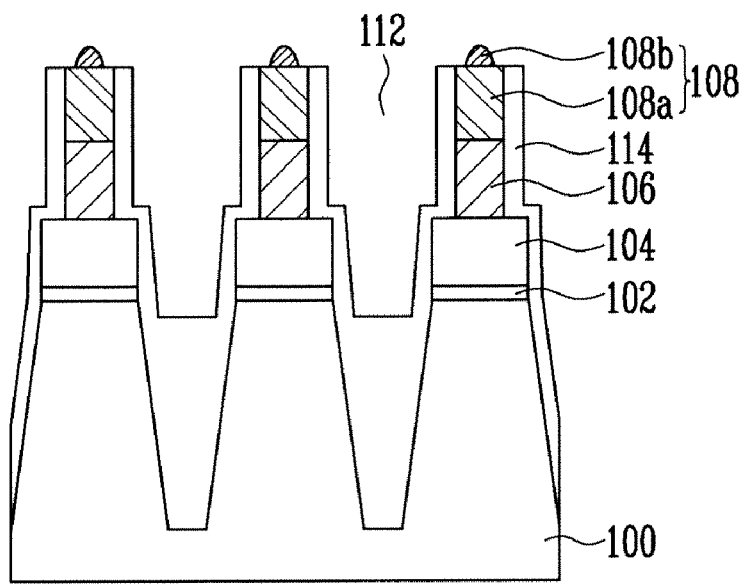

Referring to FIG. 1D, in order to secure a space and remove an overhang on an upper area of the trench 112, a wet etching process is performed to etch a portion of the second insulating layer 114.

Figure 1E:
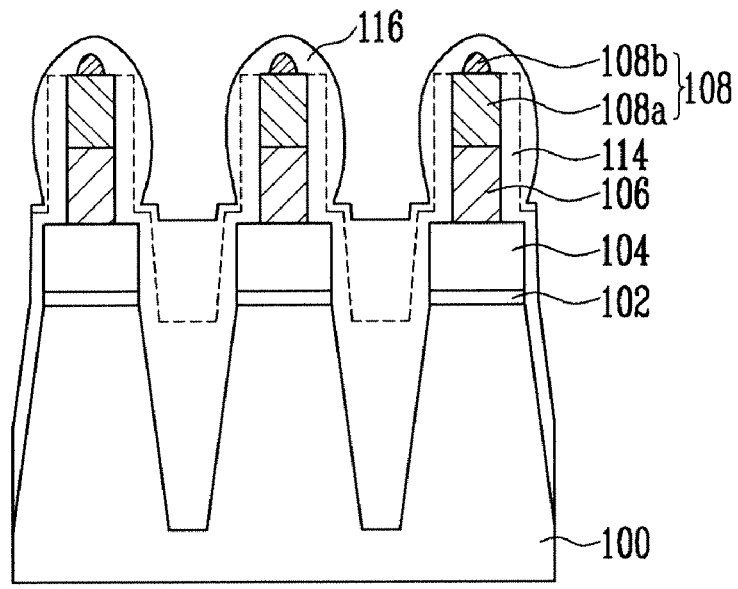

Referring to FIG. 1E, a third insulating layer 116 is formed on the semiconductor substrate 100 including the trench 112. In this embodiment, the third insulating layer 116 is formed such that the third insulating layer formed on a bottom surface of the trench 112 is thicker than that formed on a side wall of the trench 112 to fill a portion of the trench 112 with the third insulating layer and lower the aspect ratio. To achieve the above purpose, it is preferable that the third insulating layer 116 is formed of a high density plasma (HDP) oxide layer. The third insulating layer 116 formed on a side wall of the trench 112 preferably has a thickness in a range of 100 Å to 200 Å. Due to the profile of the transformed floating gates 104 and 106, it is possible to minimize the overhang formed on an upper area of the trench 112.

Figure 1F:
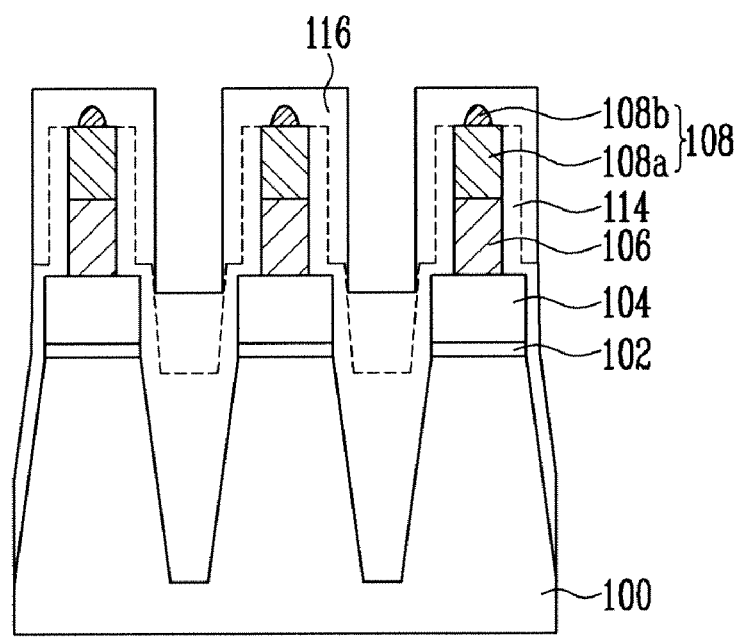

Referring to FIG. 1F, in order to secure a space and remove an overhang on an upper area of the trench 112, a wet etching process is performed to etch a portion of the third insulating layer 116. By performing repeatedly the deposition-wet etch (DW) scheme in which the wet etching process is performed after forming the second insulating layer 114 in the trench 112 and the wet etching is performed after forming the third insulating layer 116 in the trench 112, no void is generated in the trench 112.

Figure 1G:
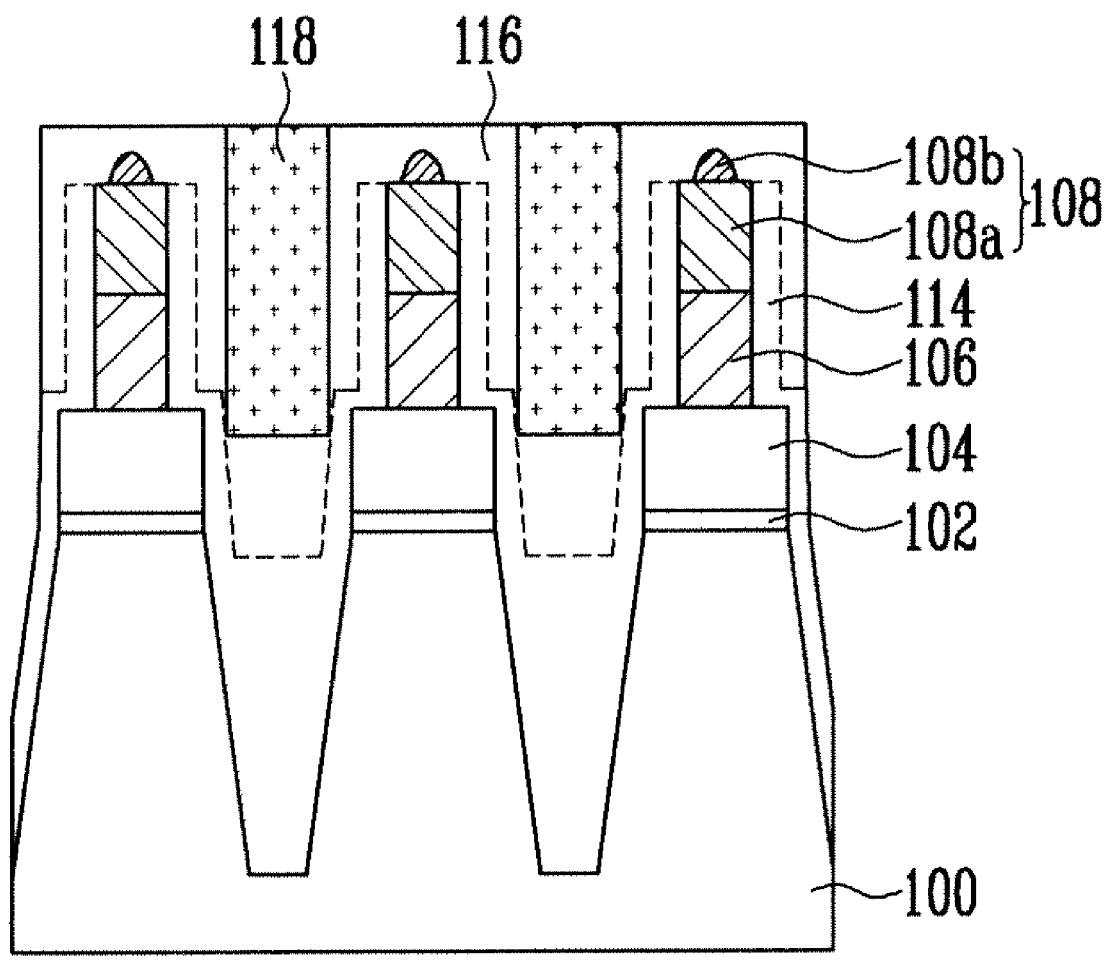

Referring to FIG. 1G, a fourth insulating layer 118 is formed on the semiconductor substrate 100 including the trench 112 to fill the trench 112 with the fourth insulating layer. In this embodiment, the fourth insulating layer 118 preferably is formed of a high density plasma (HDP) oxide layer. The trench 112 preferably is not filled with two kinds of materials, but only one material, so that EFH (effective field height) can be easily controlled by the etching ratio during the wet etching process.

As described above, the deposition-wet etch (DW) scheme in which the wet etching process is performed after forming an insulating layer is repeatedly performed to form the high density plasma oxide layer in the trench to a high level without an overhang, and so the thickness of the high density plasma oxide layer formed on the side wall of the trench can be secured. Due to the above-described structure, a shift of cycling threshold voltage is improved and it is possible to prevent the floating gate from being attacked during the wet etching process.

In addition, a side space of the first conductive layer 106 and the hard mask layer 108 at which the overhang is mainly formed is secured by transforming a profile of the floating gate so that the trench 112 can be filled without void.

Moreover, the trench 112 preferably is filled with a high density plasma oxide layer through the deposition-wet etch (DW) scheme so that it is possible to control the EFH (effective field height) during the wet etching process, and an area of the floating gate is decreased to reduce a generation of the interference phenomenon.

The present invention as described above provides one or more effects as follows.

First, the deposition-wet etch (DW) scheme is repeatedly performed to form the high density plasma oxide layer in the trench to a high level without an overhang, and so a thickness of the high density plasma oxide layer formed on the side wall of the trench can be secured.

Second, since a thickness of the high density plasma oxide layer formed on the side wall of the trench is secured, a shift of cycling threshold voltage is improved and it is possible to prevent the floating gate from being attacked during the wet etching process.

Third, a side space of the first conductive layer and the hard mask layer at which the overhang is mainly formed is secured by transforming a profile of the floating gate so that the trench can be filled without a void.

Fourth, the trench is filled with a high density plasma oxide layer through the deposition-wet etch (DW) scheme so that it is possible to control the EFH (effective field height) during the wet etching process, and an area of the floating gate is decreased to reduce generation of the interference phenomenon.

Although embodiments have been described with reference to a number of illustrative embodiments thereof, it should be understood that numerous other modifications and embodiments can be devised by those skilled in the art without undue experimentation that will fall within the spirit and scope of the principles of this disclosure. More particularly, various variations and modifications are possible in the component parts, materials, and/or arrangements of the subject combination arrangement within the scope of the disclosure, the drawings and the appended claims. In addition to variations and modifications in the component parts and/or arrangements, alternative applications and uses will also be apparent to those skilled in the art.

What is claimed is:

1. A method of forming an isolation layer in a semiconductor device, comprising the steps of:

forming a tunnel insulating layer and conductive layer patterns on an active area of a semiconductor substrate, an upper portion of the conductive layer patterns having a width narrower than that of a lower portion of the conductive layer patterns;

etching the tunnel insulating layer and the semiconductor substrate between the conductive layer patterns to form a trench;

forming an insulating layer to fill a portion of the trench with the insulating layer, wherein an overhang of the insulating layer is formed at a sidewall of the upper portion of the conductive layer while the portion of the trench is filled with the insulating layer; and performing an etching process to remove the overhang of the insulating layer formed at the sidewall of the upper portion of the conductive layer, wherein a portion of the insulating layer remains at the sidewall of the upper portion of the conductive layer and in the trench after the etching process, and wherein the step of forming the insulating layer and the step of performing the etching process are repeatedly performed until a space between the conductive layer patterns and the trench are filled with the insulating layer.

2. The method of claim 1, further comprising forming a spacer on a side wall of the upper portion of the conductive layer patterns with a narrow width prior to forming the trench.

3. The method of claim 2, wherein the steps of forming the conductive layer patterns and trench comprise;

forming the tunnel insulating layer, a first conductive layer and a second conductive layer on the semiconductor substrate;

patterning the second conductive layer;

forming the spacer on a side wall of the patterned second conductive layer;

etching the first conductive layer, the tunnel insulating layer and a portion of the semiconductor substrate through an etching process in which the spacer is used as an etching mask to form the trench; and removing the spacer.

4. The method of claim 3, comprising removing the spacer through a wet etching process.

5. The method of claim 3, comprising removing the spacer to secure a space formed at a side of the second conductive layer in a range of 45 nm to 55 nm.

6. The method of claim 1, comprising forming the insulating layer of a high density plasma oxide layer so that the insulating layer formed on a bottom surface of the trench is thicker than that formed on a side wall of the trench.

7. The method of claim 1, comprising forming the insulating layer on side walls of the trench to a thickness in a range of 100 Å to 200 Å.

8. The method of claim 1, wherein the etching process is a wet etching process.

* * * * *